US009362167B2

(12) United States Patent
Shimada et al.

(10) Patent No.: US 9,362,167 B2
(45) Date of Patent: Jun. 7, 2016

(54) METHOD OF SUPPLYING COBALT TO RECESS

(71) Applicant: TOKYO ELECTRON LIMITED, Tokyo (JP)

(72) Inventors: Atsushi Shimada, Nirasaki (JP); Shinji Furukawa, Nirasaki (JP); Tatsuo Hatano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/620,886

(22) Filed: Feb. 12, 2015

(65) Prior Publication Data

US 2015/0243556 A1    Aug. 27, 2015

(30) Foreign Application Priority Data

Feb. 24, 2014 (JP) ................... 2014-032941

(51) Int. Cl.
*H01L 21/20* (2006.01)
*H01L 21/768* (2006.01)
*H01L 21/285* (2006.01)

(52) U.S. Cl.
CPC ...... *H01L 21/76882* (2013.01); *H01L 21/2855* (2013.01); *H01L 21/76843* (2013.01); *H01L 21/76876* (2013.01)

(58) Field of Classification Search
CPC ............ H01L 51/0072; H01L 51/5016; H01L 51/0085; H01L 51/0021; H01L 51/0042; H01L 51/0046; H01L 51/0077; H01L 51/008; H01L 51/0084; H01L 51/0508; H01L 51/4246; H01L 51/4273; H01L 51/442; H01L 51/448; H01L 51/5064; H01L 51/5076; H01L 51/5092; H01L 51/5096; H01L 51/5203; H01L 51/5206; H01L 51/5209; H01L 51/5215; H01L 51/5221; H01L 51/524; H01L 51/5246; H01L 51/5265; H01L 51/5275; H01L 51/5278; H01L 51/529; H01L 51/006; H01L 51/0074; H01L 51/0073; H01L 51/0054; H01L 51/0059; H01L 51/5012; H01L 51/5072; H01L 51/504; H01L 51/0058; H01L 51/0067; H01L 51/0052; H01L 2924/0002; H01L 2924/00; H01L 2924/12041; H01L 2251/5384; H01L 2251/308; H01L 2251/5376; H01L 2251/552; H01L 2251/558; H01L 2251/305; H01L 2251/306; H01L 2251/53; H01L 2251/5338; H01L 2251/5346; H01L 2251/5361; H01L 2251/55; H01L 2251/556; H01L 27/32; H01L 27/286; H01L 27/288; H01L 27/3244; H01L 27/3232; H01L 27/0248; H01L 27/307; H01L 27/3209; H01L 27/322; H01L 25/048; H01L 21/76877; H01L 21/78; H01L 21/283; H01L 21/304; H01L 21/30604; H01L 21/32133; H01L 21/56; H01L 21/76882; H01L 2224/16; H01L 2224/83192; H01L 23/481; H01L 23/296; H01L 23/49838; H01L 33/502; H01L 33/50; H01L 33/504; H01L 24/83; H01L 2933/0041; H01L 31/048; H01L 31/0481; H01L 31/1884
See application file for complete search history.

(56) References Cited

U.S. PATENT DOCUMENTS

| 2008/0132050 | A1* | 6/2008 | Lavoie | ................ | C23C 14/0084 |
| | | | | | 438/584 |
| 2009/0246952 | A1* | 10/2009 | Ishizaka | ................ | C23C 16/34 |
| | | | | | 438/653 |
| 2013/0134494 | A1* | 5/2013 | Hong | ................ | H01L 23/53238 |
| | | | | | 257/316 |

FOREIGN PATENT DOCUMENTS

JP     2013-171940 A    9/2013

*Primary Examiner* — Chuong A Luu
*Assistant Examiner* — Cory Eskridge
(74) *Attorney, Agent, or Firm* — Nath, Goldberg & Meyer; Jerald L. Meyer

(57) ABSTRACT

A method of supplying cobalt to a recess formed in an insulation film of an object to be processed is disclosed. In one embodiment, the method includes forming a cobalt nitride film on a surface of the insulation film comprising a surface defining the recess, forming a cobalt film on the cobalt nitride film, and heating the cobalt film.

6 Claims, 8 Drawing Sheets

METHOD OF SUPPLYING COBALT TO RECESS

CROSS-REFERENCE TO RELATED APPLICATION

This application claims the benefit of Japanese Patent Application No. 2014-032941, filed on Feb. 24, 2014, in the Japan Patent Office, the disclosure of which is incorporated herein in its entirety by reference.

TECHNICAL FIELD

The present disclosure relates to a method of supplying cobalt to a recess.

BACKGROUND

In manufacture of electronic devices, a metallic material may be buried in a recess formed in an insulation film. For example, wiring is formed by burying the metallic material in a contact hole or a trench. A reflow technology has been known as an example of a process for burying the metallic material.

In the reflow technology, a film of a metallic material is formed on a surface of an insulation film having a recess. Thereafter, an object to be processed, which has the film of the metallic material, is heated. Thus, the recesses are filled with the metallic material, which becomes fluidified in this way.

In a conventional reflow technology, a barrier layer is formed on an insulation film, a seed layer containing copper is formed on the barrier layer, and a fixed layer is formed on the seed layer. The fixed layer is formed with materials such as Ta, Ti, W, Ni, Ru and Mn, oxides of these materials or nitrides of these materials. When an object to be processed is heated, the seed layer and the fixed layer become fluidified, and a recess is filled with the fluidified material. This technology suppresses generation of cavities, such as voids, in the recess, using the fixed layer.

There is a need in some circumstances to use cobalt as a material to be buried in a recess formed in an insulation film. However, if the reflow technology is applied to a cobalt film, the cobalt may accumulate preventing the fluidified cobalt from flowing toward the recess.

Therefore, it is necessary to supply cobalt to a recess formed in an insulation film while suppressing the generation of cavities.

SUMMARY

According to one embodiment of the present disclosure, provided is a method of supplying cobalt to a recess formed in an insulation film of an object to be processed. The method includes: forming a cobalt nitride film on a surface of the insulation film including a surface defining the recess; forming a cobalt film on the cobalt nitride film; and heating the cobalt film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
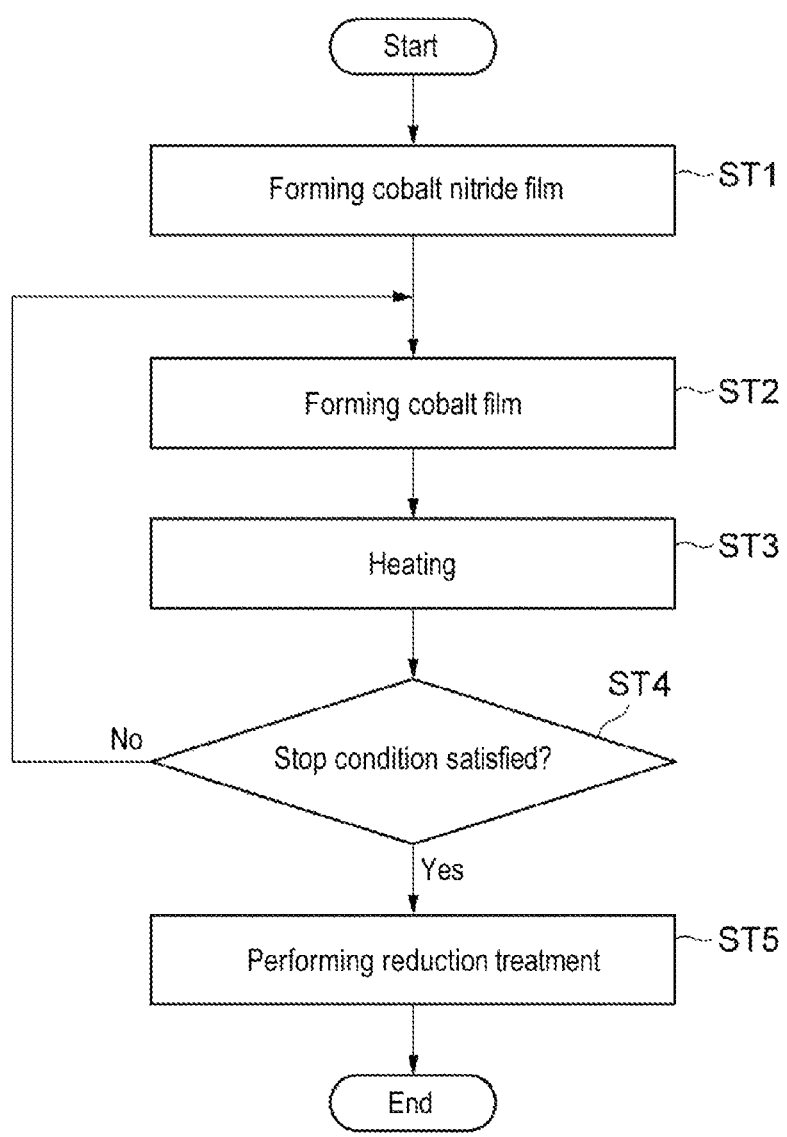
FIG. 1 is a flowchart illustrating one embodiment of a method of supplying cobalt to a recess.

Hereinafter, various embodiments of the present disclosure will be described in detail with reference to the accompanying drawings. In the drawings, the same reference numerals denote the same or corresponding components. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flowchart illustrating one embodiment of a method of supplying cobalt to a recess. The method illustrated in FIG. 1 is a method of supplying cobalt to a recess formed in an insulation film. In this method, a nitride cobalt film is formed on a surface of an insulation film including faces forming recesses at Step ST1. Thereafter, a cobalt film is formed on the nitride cobalt film at Step ST2. In addition, the cobalt film is heated by performing Step ST3 after or together with Step ST2. Therefore, the cobalt is supplied to the recesses.

Figure 2:
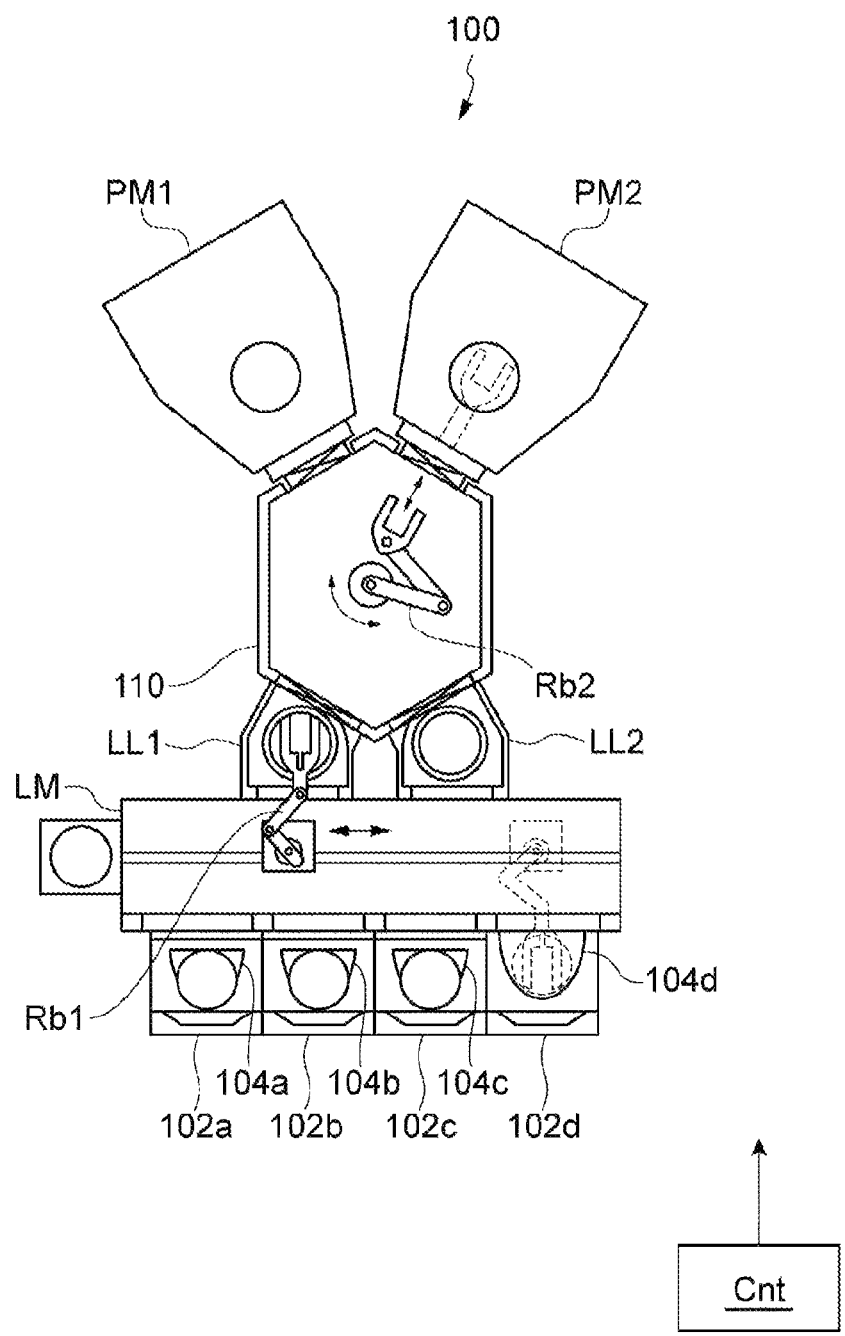
FIG. 2 is a diagram illustrating a process system according to one embodiment of the present disclosure.

Hereinafter, prior to detailed descriptions on the method of FIG. 1, a process system, which can be used for carrying out the method in FIG. 1, will be described. FIG. 2 is a diagram illustrating a process system according to one embodiment of the present disclosure. A process system 100 illustrated in FIG. 2 is provided with a process module for Step ST2 and a process module for Step ST3. The process system 100 includes tables 102a to 102d, receiving containers 104a to 104d, a loader module LM, a load lock chamber LL1, a load lock chamber LL2, a process module PM1, a process module PM2, and a transfer chamber 110.

The tables 102a to 102d are arranged along one side of the loader module LM. The receiving containers 104a to 104d are mounted on the tables 102a to 102d, respectively. Objects W to be processed (hereinafter, referred to as wafers) are received in the receiving containers 104a to 104d.

A transfer robot Rb1 is installed in the loader module LM. The transfer robot Rb1 extracts a wafer W received in any one of the receiving containers 104a to 104d and transfers the wafer W to the load lock chamber LL1 or LL2.

The load lock chambers LL1 and LL2 are arranged along the other side of the loader module LM. The load lock chambers LL1 and LL2 constitute preliminary decompression chambers. The load lock chambers LL1 and LL2 are connected to the transfer chamber 110 through gate valves, respectively.

The transfer chamber 110 is a pressure-reducible chamber and is provided with a transfer robot Rb2 therein. The process modules PM1 and PM2 are connected to the transfer chamber 110 through gate valves, respectively. The transfer robot Rb2 extracts the wafer W from the load lock chamber LL1 or LL2 and transfers the extracted wafer W to the process module PM1 or PM2. In addition, the transfer robot Rb2 transfers the wafer W between the process modules PM1 and PM2.

The process module PM1 is used for Steps ST1 and ST2 and is a film formation apparatus for forming a film by sputtering. In addition, the process module PM2 is a heat treatment apparatus.

Figure 3:
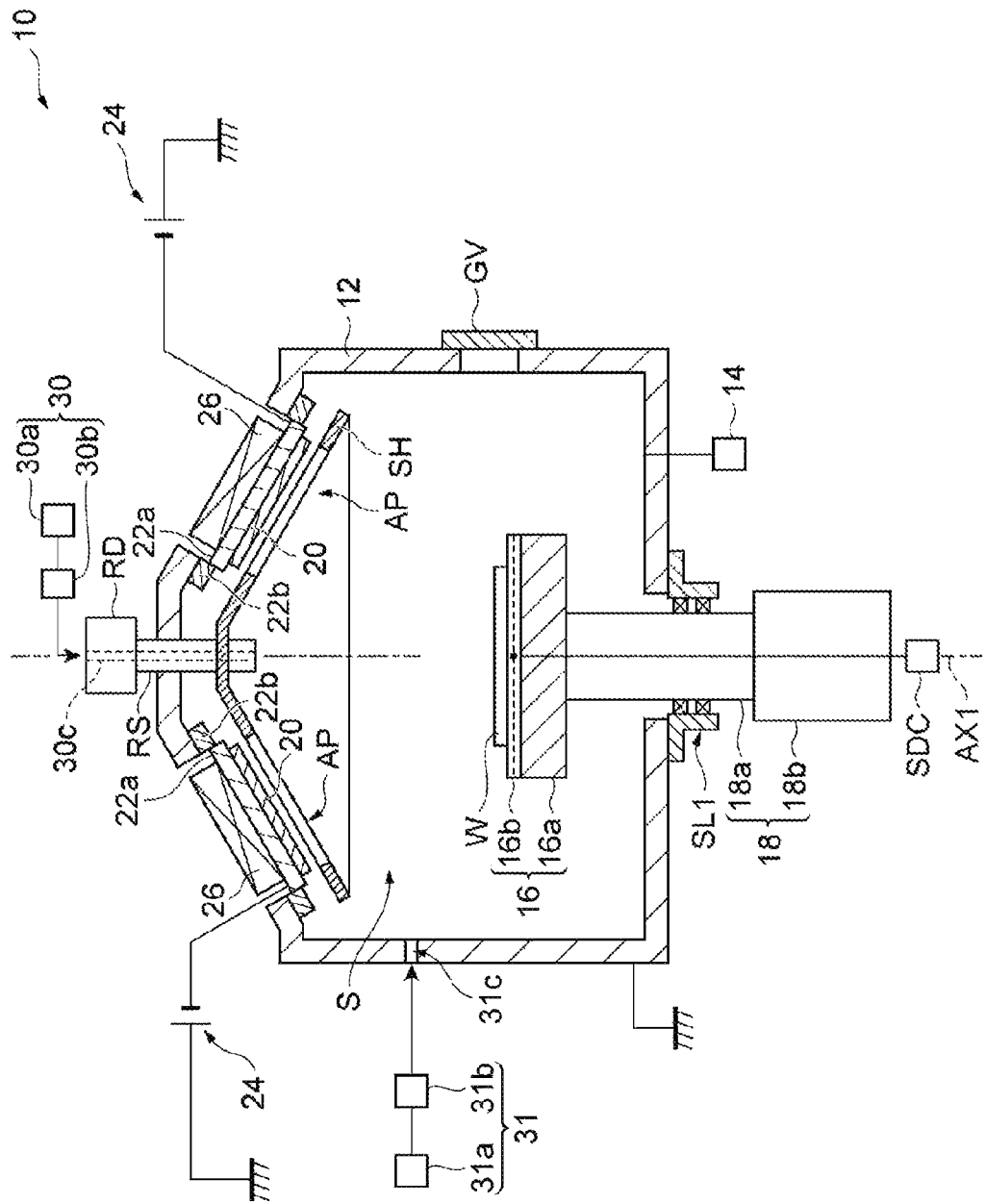
FIG. 3 is a diagram illustrating a film formation apparatus according to one embodiment of the present disclosure.

FIG. 3 is a diagram illustrating a film formation apparatus according to one embodiment of the present disclosure. A film formation apparatus 10 illustrated in FIG. 3 may be a film formation apparatus, which can be used as the process module PM1 of the process system 100. The film formation apparatus 10 is provided with a process chamber 12. The process chamber 12 is formed of, for example, aluminum and connected to a ground potential. The process chamber 12 has a space S therein. An exhaust device 14 configured to depressurize the space S is connected to the bottom of the process chamber 12. The exhaust device 14 may include, for example, a cryopump and a dry pump. In addition, an opening for transfer of a wafer W is formed at a sidewall of the process chamber 12 and a gate valve GV configured to open/close the opening is provided along the sidewall.

A stage 16 is provided in the process chamber 12. The stage 16 may include a base 16a and an electrostatic chuck 16b. The base 16a is formed of, for example, aluminum, and has an approximate disc shape.

The electrostatic chuck 16b is placed on the base 16a. The electrostatic chuck 16b has a dielectric film and an electrode provided as an internal layer of the dielectric film. A direct current power supply SDC is connected to the electrode of the electrostatic chuck 16b. The wafer W placed on the electrostatic chuck 16b is attracted to the electrostatic chuck 16b by electrostatic force generated in the electrostatic chuck 16b.

The stage 16 is connected to a stage drive mechanism 18. The stage drive mechanism 18 includes a support shaft 18a and a drive device 18b. The support shaft 18a is a member of an approximate pillar shape. A central axis line of the support shaft 18a substantially corresponds to an axis line AX1 extending in a vertical direction. The axis line AX1 passes through the center of the stage 16 in the vertical direction. The support shaft 18a extends from the bottom of the stage 16 to the outside of the process chamber 12 by passing through the bottom of the process chamber 12. A sealing member SL1 is installed between the support shaft 18a and the bottom of the process chamber 12. The sealing member SL1 seals a space between the bottom of the process chamber 12 and the support shaft 18a such that the support shaft 18a can rotate and move upwards and downwards. The sealing member SL1 may be, for example, a magnetic fluid seal.

The stage 16 is coupled to an upper end of the support shaft 18a and the drive device 18b is connected to a lower end of the support shaft 18a. The drive device 18b generates power to rotate and move the support shaft 18a upwards and downwards. As the support shaft 18a rotates, the stage 16 rotates about the axis line AX1, and as the support shaft 18a moves upwards and downwards, the stage 16 moves upwards and downwards.

One or more targets (cathode targets) 20 are provided above the stage 16. The targets 20 are made of a cobalt material. In one example, four targets 20 are provided. The targets 20 are arranged along a circular arc centered on axis line AX1. In addition, the number of targets 20 is not limited thereto, and one or more arbitrary targets may be provided.

The targets 20 are held by metallic holders 22a. The holders 22a are supported at a ceiling of the process chamber 12 through insulation members 22b. A power supply 24 is connected to the targets 20 through the holders 22a. The power supply 24 applies a negative DC voltage to the targets 20. In addition, the power supply 24 may be a single power supply selectively applying voltage to the plural targets 20. Alternatively, the power supply 24 may also be a plurality of power supplies electrically connected to the plural targets 20, respectively.

In the film formation apparatus 10, one or more magnets (cathode magnets) 26 are provided outside the process chamber 12 to face the corresponding targets 20 via the holders 22a.

In addition, a shutter SH is disposed between the targets 20 and the stage 16. The shutter SH extends to face surfaces of the targets 20. In one example, the shutter SH has a shape along conical surfaces centered on the axis line AX1.

Openings AP are formed in the shutter SH. In addition, a rotating shaft RS is coupled to a central portion of the shutter SH. The rotating shaft RS is a member of a pillar shape and its central axis line approximately corresponds to the axis line AX1. One end of the rotating shaft RS is coupled to the central portion of the shutter SH inside the process chamber 12. In addition, the rotating shaft RS extends from the inside of the process chamber 12 to the outside thereof through the ceiling. The other end of the rotating shaft RS is connected to a drive device RD outside the process chamber 12. The drive device RD generates power to rotate the rotating shaft RS. As the rotating shaft RS rotates about the axis line AX1 by the generated power, the shutter SH may rotate about the axis line AX1. Positions of the openings AP relative to the targets 20 are changed by the rotation of the shutter SH. Therefore, the targets 20 are shielded from the stage 16 by the shutter SH or exposed to the stage 16 through the openings AP of the shutter SH.

In addition, the film formation apparatus 10 is provided with a gas supply unit 30 that supplies gas to the process chamber 12. In one embodiment, the gas supply unit 30 includes a gas source 30a, a flow controller 30b such as a mass flow controller, and a gas introducing part 30c. The gas source 30a is a source of gas to be excited in the process chamber 12. For example, the gas source unit 30 is a source of rare gas such as Ar gas. The gas source 30a is connected to the gas introducing part 30c through the flow controller 30b. The gas introducing part 30c is a gas line through which gas is introduced into the process chamber 12 from the gas source 30a. In one embodiment, the gas introducing part 30c extends along the axis line AX1.

When gas is supplied from the gas supply unit 30 to the process chamber 12 and the power supply 24 applies voltage to the targets 20, the gas supplied to the process chamber 12 is excited. In addition, magnetic fields are generated in the vicinity of the targets 20 corresponding to the magnets 26. Thus, plasma is focused in the vicinity of the targets 20. Further, positive ions in the plasma collide with the targets 20 to thereby release cobalt from the exposed targets. Thus, the cobalt is deposited onto the wafer W. As a result, a cobalt film is formed on the wafer W.

In addition, the film formation apparatus 10 is provided with a gas supply unit 31 that supplies gas to the process chamber 12. In one embodiment, the gas supply unit 31 includes a gas source 31a, a flow controller 31b such as a mass flow controller, and a gas introducing part 31c. The gas source 31a is a nitrogen (N$_2$) gas source. The gas source 31a is connected to the gas introducing part 31c through the flow controller 31b. The gas introducing part 31c is a gas line through which gas is introduced into the process chamber 12 from the gas source 31a. In one embodiment, the gas introducing part 30c is provided at a sidewall of the process chamber 12.

When gases from the gas supply units 30 and 31 are supplied to the process chamber 12 and the power supply 24 applies voltage to the targets 20, cobalt is released from the targets 20 and nitrified. As a result, a cobalt nitride film is formed on the wafer W.

Figure 4:
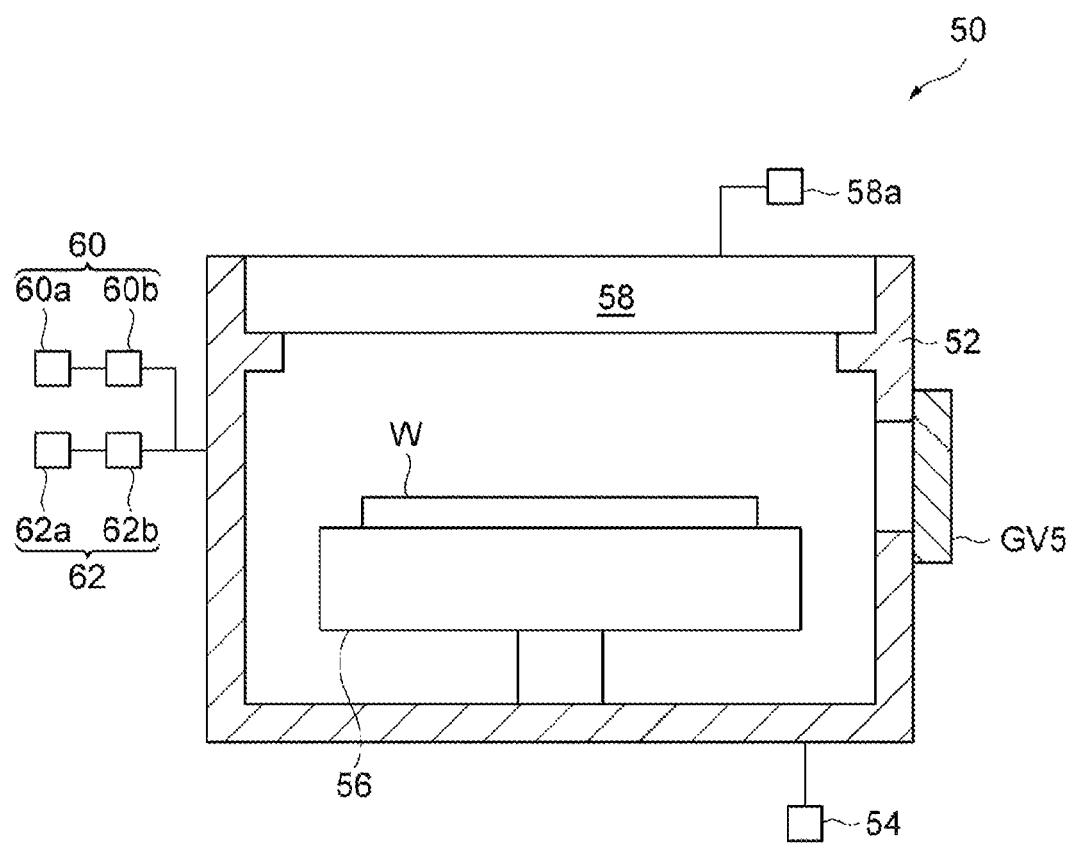
FIG. 4 is a diagram illustrating a heat treatment apparatus according to one embodiment of the present disclosure.

Next, it will refer to FIG. 4. FIG. 4 is a diagram illustrating a heat treatment apparatus according to one embodiment of the present disclosure. A heat treatment apparatus 50 illustrated in FIG. 4 is a heat treatment apparatus, which can be used as the process module PM2 of the process system 100. The heat treatment apparatus 50 is provided with a process chamber 52. The process chamber 52 is formed of, for example, aluminum. An exhaust device 54 configured to depressurize an internal space of the process chamber 52 is connected to the bottom of the process chamber 52. The exhaust device 54 may include, for example, a cryopump and a dry pump. In addition, an opening for transfer of a wafer W is formed at a sidewall of the process chamber 12 and a gate valve GV configured to open/close the opening is provided along the sidewall.

A stage 56 is provided in the process chamber 52. The wafer W is placed on the stage 56. A lamp unit 58 as a heat source is provided above the stage 56. A power supply 58a supplying power to the lamp unit 58 is connected to the lamp unit 58.

In addition, the heat treatment apparatus 50 further includes a gas supply unit 60 and a gas supply unit 62. The gas supply unit 60 includes an inert gas source 60a and a flow controller 60b. Inert gas is a rare gas such as, for example, Ar gas. The gas supply unit 62 includes a reducing gas source 62a and a flow controller 62b. Reducing gas is used to remove nitrogen from a film to be processed and includes hydrogen gas. For example, the reducing gas is H$_2$ gas. The gas supply units 60 and 62 are connected to the internal space of the process chamber 52 through, for example, a gas line formed at a sidewall of the process chamber 52.

In the heat treatment apparatus 50, the wafer W may be heated by operating the lamp unit 58. When the wafer W is heated, the inert gas may be supplied to the process chamber 52 from the gas supply unit 60. In addition, in the heat treatment apparatus 50, nitrogen contained in the wafer W may be removed by supplying the reducing gas from the gas supply unit 62 to the process chamber 52 and operating the lamp unit 58.

It will refer to FIG. 2 again. As illustrated in FIG. 2, the process system 100 further includes a controller Cnt. The controller Cnt controls the respective parts of the process system 100, the respective parts of the process module PM1 (e.g., the film formation apparatus 10), and the respective parts of the process module PM2 (e.g., the heat treatment apparatus 50). The controller Cnt may be, for example, a computer device and have a storage device storing a recipe required to carry out the method in FIG. 1 and a processor controlling the respective parts of the process system 100 according to the recipe.

Hereinafter, the method will be described in more detail with reference to FIG. 1. In addition, the following description will be given with reference to FIGS. 5A-5B and 6A-6B. FIGS. 5A-5B and 6A-6B are cross-sectional views illustrating states of an object to be processed, after the respective processes of the method in FIG. 1.

Figure 5A:
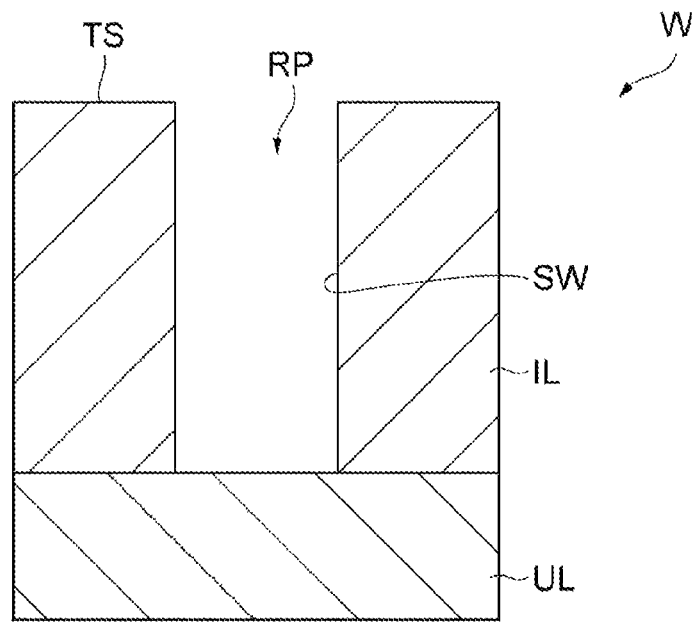
FIGS. 5A and 5B are cross-sectional views illustrating states of an object to be processed, after the respective steps of the method in FIG. 1.
Figure 5B:
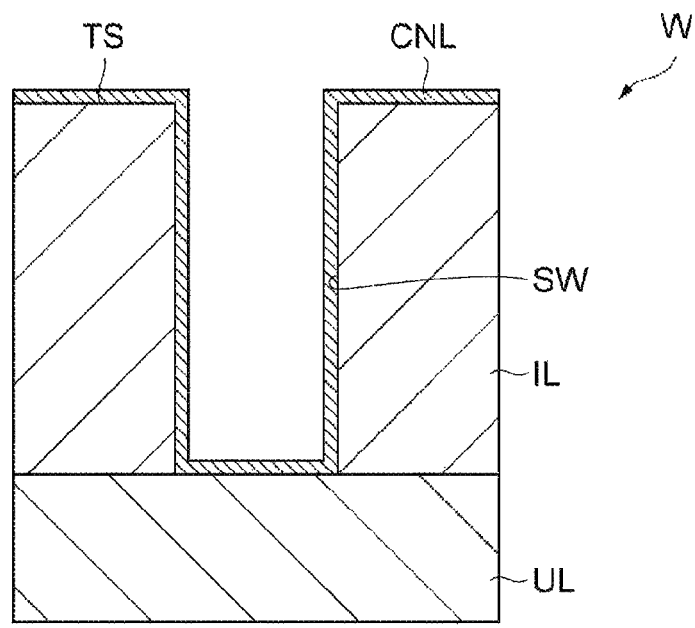

As illustrated in FIG. 1, in the method, the process ST1 is initially performed. In the process ST1, a cobalt nitride film is formed on a wafer W illustrated in FIG. 5A. As illustrated in FIG. 5A, the wafer W has an underlayer UL and an insulation film IL. The insulation film IL is formed of, for example, a silicon oxide film or so-called low-k material and formed on the underlayer UL. A recess RP, such as a trench or a hole, is formed in the insulation film IL. In Step ST1, a cobalt nitride film CNL is formed on the wafer W, so that a wafer W illustrated in FIG. 5B is fabricated. Specifically, the cobalt nitride film CNL is formed on sidewall surfaces SW of the insulation film IL, which defines the recess RP, an upper surface TS of the insulation film IL, and a surface of the underlayer UL, which defines the recesses RP.

In performing Step ST1 of the method in FIG. 1 using the process system 100 illustrated in FIG. 2, a wafer W is transferred into the process module PM1, that is, the process chamber 12 of the film formation apparatus 10 and placed on the stage 16. The pressure of the space S in the process chamber 12 is set to a predetermined pressure, and a rare gas and nitrogen gas are supplied from the gas supply units 30 and 31, respectively. The stage 16 rotates, and voltage is applied to the targets 20 from the power supply 24. For example, the DC voltage applied from the power supply 24 to the targets 20 has a power of 1.5 kW, and flow rates of the rare gas (Ar gas) and the nitrogen gas (N$_2$ gas) are set within ranges of 100 sccm and 3 sccm to 20 sccm, respectively. The pressure of the space S in the process chamber 12 is set to several mTorr. In addition, a distance in a vertical direction between the targets 20 and the stage 16 is set to, for example, 280 mm. Due to this, cobalt released from the targets 20 is nitrided, and the nitride cobalt is deposited onto the wafer W. As a result, a cobalt nitride film CNL is formed. The cobalt nitride film CNL is formed not to close the recess RP. The cobalt nitride film CNL depends on a size of the recess RP and is formed to have a film thickness of, for example, 20 nm.

In one example, the wafer W may be heated before the cobalt film is formed in Step ST2 after performing the process ST1. When the heating of the wafer W is performed using the process system 100 illustrated in FIG. 2, the wafer W illustrated in FIG. 5B is transferred to the process module PM2, that is, the heat treatment apparatus 50 and heated by the heat treatment apparatus 50. For example, the wafer W is heated to a temperature of 300 to 400 degrees C. under a pressure environment of $5 \times 10^{-7}$ Torr for 60 seconds. As described above, the wafer W is heated between Steps ST1 and ST2, thereby increasing fluidity of a cobalt film to be formed in the following step.

Next, in the method in FIG. 1, Step ST2 is performed. In Step ST2, a cobalt film CL is formed on the cobalt nitride film CNL as illustrated in FIG. 6A.

In performing Step ST2 of the method in FIG. 1 using the process system 100 illustrated in FIG. 2, the wafer W is transferred into the process module PM1, that is, the process chamber 12 of the film formation apparatus 10 and placed on the stage 16. The pressure of the space S in the process chamber 12 is set to a predetermined pressure, and a rare gas is supplied from the gas supply units 30. The stage 16 rotates, and a voltage is applied to the targets 20 from the power supply 24. For example, the DC voltage applied from the power supply 24 to the targets 20 has a power of 1.5 kW, and a flow rate of the rare gas (Ar gas) is set to 100 sccm. The pressure of the space S in the process chamber 12 is set to several mTorr, for example, 0.7 mTorr. In addition, a distance in a vertical direction between the targets 20 and the stage 16 is set to, for example, 280 mm. Due to this, cobalt released from the targets 20 is deposited onto the cobalt nitride film CNL. As a result, a cobalt film CL is formed. The cobalt film CL is formed not to close the recess RP. The cobalt film CL depends on a size of the recess RP and is formed to have a film thickness of, for example, 10 nm.

Then, in the method in FIG. 1, Step ST3 is performed. In Step ST3, the wafer W is heated. Due to this, as illustrated in FIG. 6B, the cobalt making up the cobalt film CL flows toward a bottom of the recess RP to form a filling region FR of cobalt. Through Step ST3, the recess RP is filled with the cobalt from the bottom thereof.

Figure 6A:
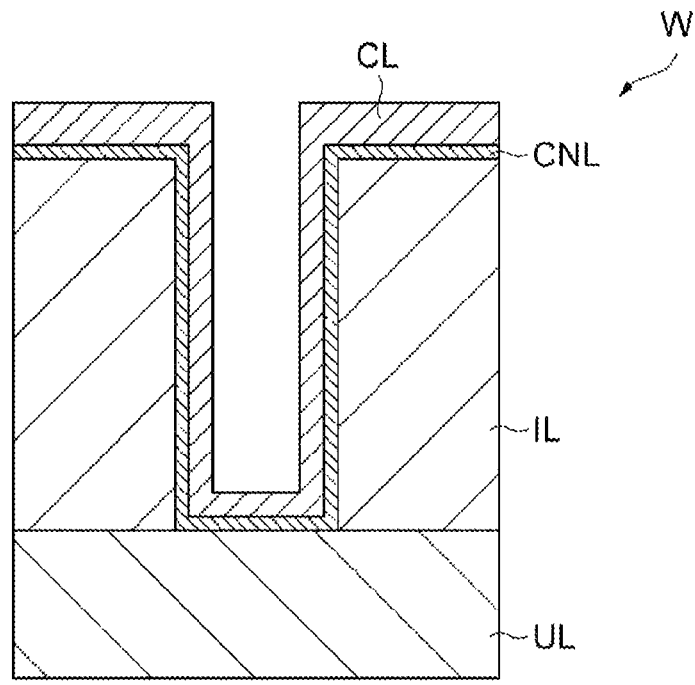
FIGS. 6A and 6B are cross-sectional views illustrating states of an object to be processed, after the respective steps of the method in FIG. 1.
Figure 6B:
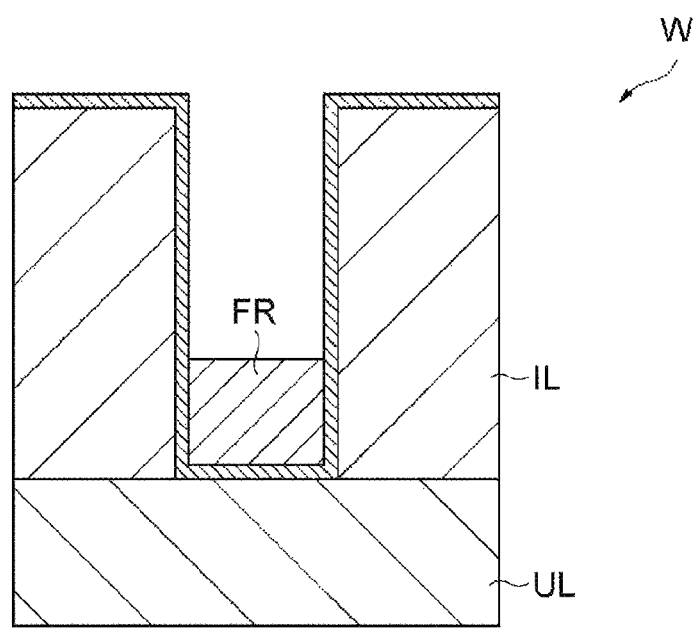

In performing Step ST3 of the method in FIG. 1 using the process system 100 illustrated in FIG. 2, the wafer W illustrated in FIG. 6A is transferred to the process module PM2, that is, the heat treatment apparatus 50 and heated by the heat treatment apparatus 50. For example, the wafer W is heated to a temperature of 300 to 400 degrees C. under a pressure environment of $5 \times 10^{-7}$ Torr for 60 seconds.

In one example, Steps ST2 and ST3 are alternately performed a plurality of times. That is, Steps ST2 and ST3 are alternately repeated. Through such repetition, the recess RP is filled with the cobalt. Therefore, it is possible to fill a large recess with the cobalt.

In Step ST4 of the method in FIG. 1, a determination is made as to whether a stop condition is satisfied. The stop condition is a condition which is determined on whether the number of repetitions of Steps ST2 and ST3 reaches a predetermined number or not. When the number of repetitions of Steps ST2 and ST3 does not reach the predetermined number, Step ST2 and ST3 are performed again. When the number of repetitions of Steps ST2 and ST3 reaches the predetermined number, the repetition of Step ST2 and ST3 is terminated.

In one embodiment, in the method in FIG. 1, Step ST5 may be additionally performed. In Step ST5, reduction treatment is performed on the wafer W. Due to this, nitrogen that originated from the cobalt nitride film CNL of the wafer W is removed.

In performing Step ST5 of the method in FIG. 1 using the process system 100 illustrated in FIG. 2, the wafer W is transferred to the process module PM2, that is, the heat treatment apparatus 50 and heated by the heat treatment apparatus 50. The wafer W is heated to a temperature of 300 to 400 degrees C. in a reducing gas atmosphere, for example, in an $H_2$ atmosphere, for 60 seconds.

Figure 7A:
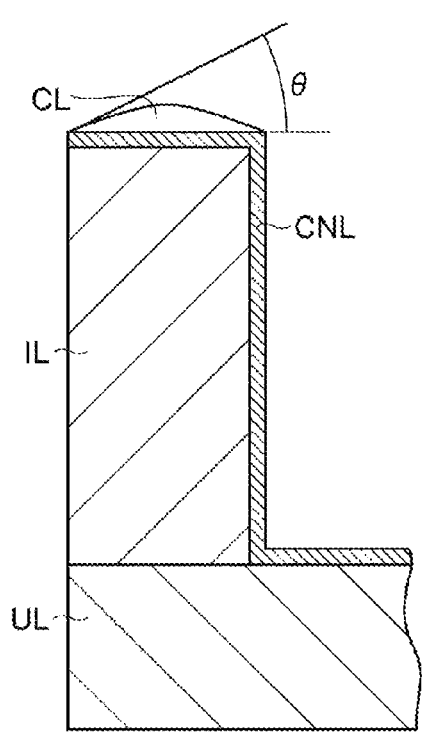
FIGS. 7A and 7B are conceptual diagrams for explaining the principle of the method in FIG. 1.
Figure 7B:
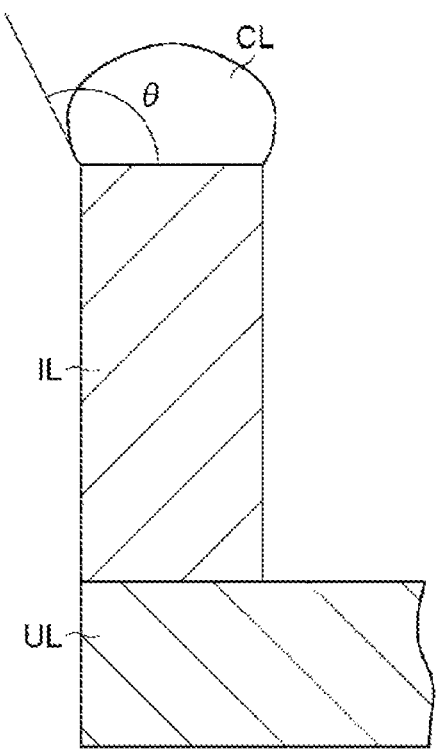

According to the method in FIG. 1 described above, the cobalt nitride film CNL is interposed between the insulation film IL and the cobalt film CL, thereby preventing cobalt from being aggregated by heating in Step ST3. FIGS. 7A and 7B are conceptual diagrams for explaining a principle of the method in FIG. 1. As illustrated in FIG. 7B, when a cobalt film CL is formed directly on an insulation film IL, the cobalt has a considerably large contact angle (θ) relative to the insulation film IL. The reason is supposed to be that, when the cobalt film is formed directly on the insulation film IL, the cobalt forms a metallic bond to thereby grow on close-packed planes in a grain growth process, which results in reducing wettability of the cobalt to the insulation film IL. Due to this, when the cobalt film CL is formed directly on the insulation film IL, the cobalt is aggregated and cavities are created in the recess.

In contrast, as illustrated in FIG. 7A, when a cobalt film CL is formed on a cobalt nitride film CNL, the cobalt has a relatively small contact angle (θ) with the cobalt nitride film CNL. The reason is supposed to be that one free electron remains with the nitrogen in the cobalt nitride film CNL and the cobalt is bonded with the nitrogen in the grain growth process, which makes the cobalt not grown on the close-packed planes, so that wettability of the cobalt to the cobalt nitride film CNL is increased. Therefore, in the method of interposing the cobalt nitride film CNL between the insulation film IL and the cobalt film CL, the fluidity of the cobalt is increased and, as a result, aggregation of the cobalt is suppressed. As such, according to the method in FIG. 1, it is possible to suppress the creation of cavities and fill the recesses RP with cobalt by supplying the cobalt to the recess RP.

Hereinafter, another embodiment of the present disclosure will be described. Although Step ST3 is performed after Step ST2 in the method described above, Steps ST2 and ST3 may also be simultaneously performed in a method according to this embodiment. That is, a wafer W may be heated while a cobalt film CL is being formed on the wafer W in a film formation apparatus. In the method according to this embodiment, the time required to transfer the wafer W between Steps ST2 and ST3 is omitted. That is, the time required to supply cobalt to a recess RP is reduced, compared with the method described above. Therefore, throughput is enhanced.

Figure 8:
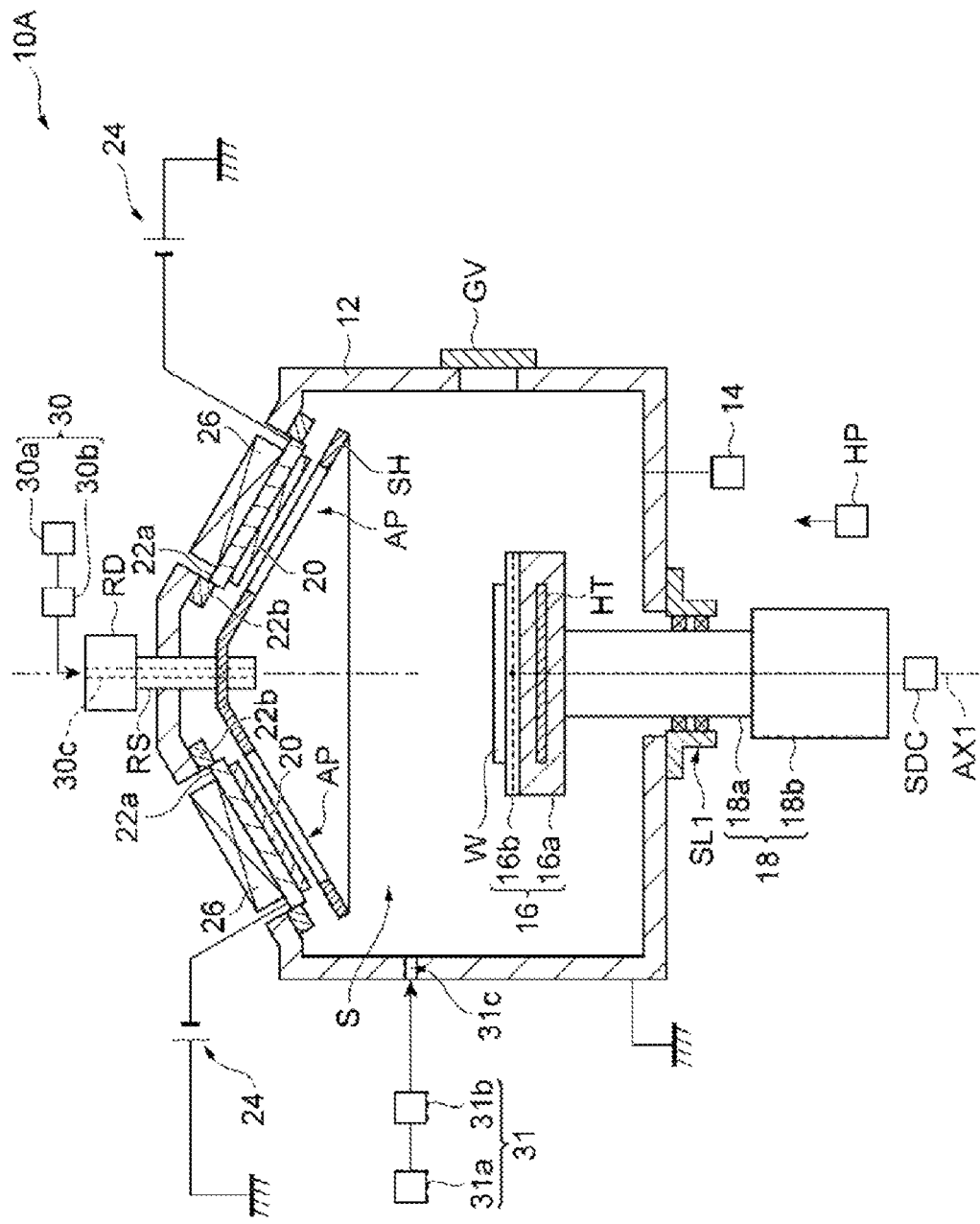
FIG. 8 is a diagram illustrating an example of a film formation apparatus for carrying out a method according to another embodiment of the present disclosure.

FIG. 8 is a diagram illustrating an example of a film formation apparatus for carrying out the method according to another embodiment of the present disclosure. A film formation apparatus 10A illustrated in FIG. 8 differs from the film formation apparatus 10 in that a stage 16 is provided with a heater HT therein. The heater HT is connected to a heater power supply HP. The heater HT may be configured with, for example, electric heating wires.

The film formation apparatus 10A may perform Step ST1. In addition, the film formation apparatus 10A may simultaneously perform Steps ST2 and ST3. That is, the film formation apparatus 10A may form a cobalt film CL while heating a wafer W using the heater HT. In other words, the film formation apparatus 10A may simultaneously perform the formation of the cobalt film CL and the supply of cobalt to recesses RP by heating.

Although various embodiments of the present disclosure have been described above, the present disclosure is not limited thereto, and various modified examples can be made. For example, the aforementioned heater HT of the film formation apparatus 10A may be an induction heater. In addition, when a gas supply unit supplying a reducing gas is connected to the film formation apparatus 10A, a method including Steps ST1, ST2, ST3, and ST5 described above may be carried out using the single film formation apparatus 10A.

As described above, it is possible to supply cobalt to the recesses formed in the insulation film while preventing creation of cavities.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of supplying cobalt to a recess formed in an insulation film of an object to be processed, comprising:
   forming a cobalt nitride film on a surface of the insulation film comprising a surface defining the recess;
   forming a cobalt film on the cobalt nitride film; and flowing cobalt making up the cobalt film toward a bottom of the recess by heating the object to be processed so as to fill the recess with cobalt from the bottom of the recess.

2. The method of claim 1, wherein the forming the cobalt film and the flowing the cobalt are alternately repeated.

3. The method of claim 1, wherein the forming the cobalt film and the flowing the cobalt are simultaneously performed.

4. The method of claim 1, further comprising:
   heating the object to be processed in a reducing gas atmosphere, after flowing the cobalt.

5. The method of claim 2, further comprising:
   heating the object to be processed in a reducing gas atmosphere, after flowing the cobalt.

6. The method of claim 3, further comprising:
   heating the object to be processed in a reducing gas atmosphere, after flowing the cobalt.

\* \* \* \* \*